United States Patent [19]

Kimura et al.

[11] Patent Number: 5,307,067
[45] Date of Patent: Apr. 26, 1994

[54] FOLDING CIRCUIT AND ANALOG-TO-DIGITAL CONVERTER

[75] Inventors: Hiroshi Kimura, Hyogo; Akira Matsuzawa, Kyoto, both of Japan

[73] Assignee: Matsushita Electric Industrial Co., Ltd., Osaka, Japan

[21] Appl. No.: 47,480

[22] Filed: Apr. 19, 1993

[30] Foreign Application Priority Data

Apr. 20, 1992 [JP] Japan .................................. 4-099235

[51] Int. Cl.$^5$ ............................................. H03M 1/36
[52] U.S. Cl. ..................................... 341/159; 341/155
[58] Field of Search ............... 341/159, 156, 161, 163, 341/155

[56] References Cited

U.S. PATENT DOCUMENTS

| | | | |
|---|---|---|---|
| 4,599,602 | 7/1986 | Matzuzawa et al. | 341/161 |
| 4,777,470 | 10/1988 | Naylor et al. | 341/163 |
| 4,931,797 | 6/1990 | Kagawa et al. | 341/162 |
| 5,181,035 | 1/1993 | Mouret | 341/161 |

FOREIGN PATENT DOCUMENTS 62-175018 7/1987 Japan .
1-10711 1/1989 Japan .
3-274918 12/1991 Japan .

OTHER PUBLICATIONS

Arbel et al.., "Fast ADC", IEEE Transactions on Nuclear Science, vol. NS-22, pp. 446-451, (Feb. 1975).

*Primary Examiner*—Brian K. Young
*Attorney, Agent, or Firm*—Willian Brinks Olds Hofer Gilson & Lione

[57] ABSTRACT

By making a folded waveform of a folding circuit sharp, the number of elements used in an ADC is reduced and less power consumption is achieved. A folding circuit is composed of a plurality of master-comparator latches, a pair of wiring means for master-to-slave connection, and a slave latch. By means of the wiring means, the non-inverted outputs and the inverted outputs of the master-comparators latches are alternately drawn in the order of magnitude of reference voltages, superimposed, and fed into a pair of inputs of the slave latch. A Gray code signal is directly encoded by an encoder according to the output of the slave latch. A folded signal, which is the output of the folding circuit, takes a sharp waveform. The number of slave latches can be reduced. No XOR gates are required.

13 Claims, 15 Drawing Sheets

FOLDING CIRCUIT AND ANALOG-TO-DIGITAL CONVERTER

BACKGROUND OF THE INVENTION

This invention relates to a folding circuit for converting an analog signal into a folded signal, and to an analog-to-digital converter (ADC) which makes use of such a folding circuit.

High-resolution image processing and high-precision instrumentation systems require high-resolution, high-speed ADC's. For the case of an HDTV (high definition TV) ADC or of a B-ISDN ADC, a resolution of 10 bits is required in addition to a conversion speed of 75 MSPS. Instrumentation systems (for example, a digitizing oscilloscope) require ADC's capable of a resolution of 10 bits and of a conversion speed of over 100 MSPS. In the application of the HDTV or B-ISDN, low-power ADC's are very attractive. For example, when used in an HDTV transmission system, signals Y, Pb, and Pr each require an ADC. This presents a problem that power consumption by such ADC's forms a considerable percentage of all power consumed in the system. An ADC with less power consumption is required, accordingly. Meanwhile, ADC's, when applied to HDTV camera devices, cannot depend upon air-cooling by means of a fan which produces unwanted noises. Therefore, less power consumption must be achieved so that an ADC allows itself to cool down spontaneously, without depending upon any forced-air cooling means. Generally, ADC's of this type are sealed within a ceramic package. If, however, less power consumption (less heat generation) is accomplished, this allows use of much cheaper plastic packages. Therefore, a circuit technology capable of reducing the number of elements and achieving lower power consumption is now required.

The prior art discloses many different ADC's. For example, Japanese Patent Application, published under No. 3-274918, shows a parallel and a serial-parallel ADC. Japanese Patent Application, published under No. 62-175018, shows a sequential-comparison ADC. Among these ADC's, the parallel ADC is simple, conforms to the principle of analog-to-digital conversion, and operates at high speeds. The parallel ADC, however, requires a great number of elements and consumes much power.

Conventional high-speed ADC's have a master/slave latch configuration in order to drive an encoder. Since the encoder lines are heavily loaded and a greater amplitude of an output signal is required, it is preferable for an ADC to employ such a master/slave latch configuration so as to drive the encoder lines with digitized data over a clock cycle for a high-speed operation. FIG. 15 illustrates a conventional parallel ADC having a master/slave latch configuration, this ADC comprising (a) a reference resistor row 1 formed by reference resistors connected in series, (b) a pre-amplifier array 2 formed by pre-amplifiers PA1 to PA7, (c) a master-comparator latch array 3 formed by master-comparator latches MCL1 to MCL7 corresponding to the pre-amplifiers PA1 to PA7, (d) a slave latch array 4 formed by slave latches SL1 to SL7 corresponding to the master-comparator latches MCL1 to MCL7, (e) an analog input terminal 5 to which an analog input voltage Vin is applied, and (f) an exclusive-OR (XOR) gate latch array 6 formed by XOR gate latches XOR1 to XOR7. Each PA is supplied with Vin through one input thereof together with a reference voltage Vr, divided and generated by each resistor of the reference resistor row 1, through the other input. The outputs of MCL1 to MCL7 are received by SL1 to SL7 in a corresponding manner. Each XOR gate latch executes an XOR operation between outputs of two adjacent slave latches, thereby giving an output so as to drive an encoder via dotting transistors (not shown).

Each MCL which contains a differential amplifier (not shown) makes a comparison between Vin and Vr during the comparison mode, thereafter providing a positive feedback to the differential voltage produced during the comparison mode for latching.

A signal conversion circuit of FIG. 13 is disclosed in the "IEEE Transactions on Nuclear Science" (Vol, NS-22, Feb. 1975, pp 446-451), which makes use of a differential amplifier. This technique shows a circuit called a folding circuit in which the outputs of plural differential amplifiers are superimposed. Vin is applied to each differential amplifier through one input thereof while each Vr (Vr1 < Vr2 < Vr3) is applied through the other input. For the case of a folding waveform corresponding to the folding circuit of FIG. 13, the differential direction makes an inversion at Vr1, Vr2, and Vr3 with respect to Vin (see FIG. 14).

SUMMARY OF THE INVENTION

A conventional folding circuit such as the one in FIG. 13 has a configuration by means of which the outputs of differential amplifiers are superimposed. This conventional folding circuit depends upon the saturation state of a differential amplifier, as a result of which a folding waveform obtained takes an unwanted form which makes no sharp transitions, as shown in FIG. 14. There is a further drawback that no folded waveforms are obtained at all if the potential difference between reference voltages of the differential amplifiers becomes smaller than a saturation voltage.

An ADC of FIG. 15 has a master-slave latch configuration in which the output of the pre-amplifier array 2 is received by the master-comparator latch array 3 as well as by the slave latch array 4. The outputs of MCL1 to MCL7 are received by SL1 to SL7, respectively. This configuration requires that the number of master-comparator latches must agree with the number of slave latches. This presents a serious problem in that the number of master-comparator latches, the number of slave latches, and the number of XOR gates for the XOR operation between outputs of adjacent slave latches all increase greatly as the number of resistors of the reference resistor row 1 is increased for higher resolutions. As a result, an enormous number of elements is required, and much more power is consumed.

Bearing in mind the above-described disadvantages of the prior art techniques, the present invention was made. A folding circuit of the invention, used to convert an analog signal into a folded signal, has an improved configuration, in which the opposite-phase output currents of comparator latches each of which contains a differential amplifier are sequentially superimposed in the order in which Vr descends, and then fed to a pair of resistors. With this arrangement, a folding waveform with a sharp turn at each reference voltage turning point is obtained. Further, the number of elements is reduced, and much less power consumption is accomplished by incorporating a folding circuit of the invention into an ADC.

A first solving means shows a folding circuit which comprises (a) a plurality of comparator latches which are fed common analog input signals through inputs thereof and different reference voltages sequentially set at predetermined intervals through the other inputs, each of the comparator latches making a comparison between an analog input voltage and a reference voltage during the comparison mode, providing a positive feedback to differential voltages resulting from the comparison, performing latch action during the latch mode, and outputting differential outputs as a non-inverted output and an inverted output from a pair of outputs of each comparator latch, (b) a load element which is simultaneously fed the differential outputs of said comparator latches through a pair of inputs thereof, and (c) a pair of wiring means through which the non-inverted outputs and the inverted outputs of the comparator latches, drawn alternately in the order of magnitude of the reference voltages of the comparator latches and superimposed, are connected to the pair of inputs of the load element, whereby the input analog signal is converted into a folded signal which becomes folded at a position corresponding to each reference voltage.

Accordingly, differential output current is output from a pair of outputs of a comparator latch. In other words, a digital current is obtained which flows either through the non-inverted output side or through the inverted output side at a time during the latch mode. A folding waveform obtained during the latch mode is most reliable because it becomes adequately folded at the transitions of Vr's of the comparator latches. Further, even though a potential difference between Vr's is lower than the saturation voltage of a differential amplifier, an adequately folded waveform is obtained at the time of the latch mode.

A second solving means shows a folding circuit of the first solving means, in which a pre-amplifier is provided so that the difference voltage between Vr and Vin is amplified and fed to each of the comparator latches.

Accordingly, the difference voltage between Vr and Vin is amplified by means of a pre-amplifier, and thus high accuracy is obtained in a high-speed folding operation.

A third solving means shows a folding circuit of the first or second solving means, wherein the load element is a resistor to convert a current signal into a voltage signal.

Accordingly, the conversion of a current signal into a voltage signal is accomplished by a simple configuration.

A fourth solving means shows a folding circuit of the first or second solving means, wherein the comparator latches are master-comparator latches and the load element is a slave latch of a current comparison type. A fifth solving means shows a folding circuit of the first or second solving means, wherein the comparator latches are master-comparator latches and the load element comprises a resistor that converts a current signal into a voltage signal and a slave latch of a voltage comparison type which is connected to the resistor in parallel.

Accordingly, a digitized folded signal is obtained over a clock cycle of the master-comparator latch, and thus driving force against the load is increased and a high-speed operation is accomplished.

A sixth solving means shows an analog-digital converter which comprises (a) a plurality of comparators which are fed common analog input signals through inputs thereof and different reference voltages sequentially set at predetermined intervals through the other inputs, and (b) an encoder which is fed the outputs of said comparators so as to encode a digital signal, wherein (1) some of said comparators are formed into a group and composed of a plurality of master-comparator latches, each of the master-comparator latches making a comparison between Vin and Vr during the comparison mode, providing a positive feedback to differential voltages resulting from the comparison, and performing latch action during the latch mode, and outputting differential outputs as a non-inverted and an inverted output from a pair of outputs thereof, and a slave latch with a pair of inputs which is fed the differential outputs of the master-comparators latches through the pair of inputs and (2) a pair of wiring means are provided through which the non-inverted outputs and the inverted outputs of the master-comparator latches, drawn alternately in the order of magnitude of the reference voltages inputted to the comparator latches and superimposed, are connected to the pair of inputs of the slave latch, whereby a folding circuit, composed of the master-comparator latches, the pair of wiring means, and the slave latch, converts the input analog signal into a folded signal which becomes folded at a position corresponding to each reference voltage.

Since the ADC employs a folding circuit, this eliminates a requirement that the number of master-comparator latches is equal to the number of slave latches. A digital output signal is obtained with a minimum number of slave latches corresponding to the number of bits. The element count is reduced remarkably and much less power consumption is achieved.

A seventh solving means shows an analog-digital converter of the sixth solving means, wherein (a) the master-comparator latches are arranged at positions corresponding to the code transitions of a digital output signal, (b) the number of said slave latches is at least equal to the number of bits of a digital output, and (c) the encoder performs direct encoding with the output of the slave latch.

Since the non-inverted outputs and the inverted outputs of the master-comparator latches corresponding to the code transitions of a digital output signal are alternately superimposed, superimposed current in the latch mode becomes a differential digital current having a waveform which becomes adequately folded at the code transitions. The slave latch drives the encoder according to the differential digital current. Accordingly, no XOR gates are needed. Digital output signals can be obtained easily and rapidly.

An eighth solving means shows an analog-digital converter of the seventh solving means, wherein (a) at least one folding circuit is provided to every bit excluding the most significant bit of a digital output signal, (b) a master-comparator latch in a folding circuit that encodes the least significant bit is arranged so that a folded output signal is folded periodically for every two reference voltages, (c) a master-comparator latch in a folding circuit that encodes a particular bit higher than the least significant bit is arranged so that a folded output signal is folded in a double cycle at a mid-point between folded points of a folded signal output from a folding circuit that encodes a bit lower than the particular bit by one bit, and (d) the encoder encodes a digital signal represented by Gray codes.

Since the folding circuit outputs a folded signal corresponding to a Gray code bit, digital output signals represented by Gray codes can be obtained easily and rapidly.

A ninth solving means shows an analog-digital converter of the sixth, seventh, or eighth solving means, wherein (a) the digital output signal is divided into a high-order and a low-order code, and (b) a slave latch that encodes the high-order code is fed a signal formed by an XOR between outputs of the master-comparator latches corresponding to the transitions of the high-order code, while on the other hand a slave latch that encodes the low-order code is fed the output of the folding circuit.

Accordingly, the increase of the number of wirings is suppressed in a case where a digital signal formed by a great number of bits is output. Further, conversion errors, taking place when the distance between master-comparator latches becomes great, can be prevented. This achieves a high-resolution ADC.

A tenth solving means shows an analog-digital converter of the sixth solving means, wherein (a) the slave latch is a slave latch of a voltage comparison type and has a pair of inputs, and (b) a pair of resistors that convert a current signal into a voltage signal are provided and connected to the pair of inputs in parallel.

Accordingly, setting the value of resistance to a pair of resistors allows a slave-latch of a voltage comparison type to operate smoothly.

An eleventh solving means shows an analog-digital converter of the tenth solving means, wherein the number of master-comparator latches to be provided to one folding circuit is limited to below a predetermined count.

Since the output amplitude of the folding circuit is kept above a predetermined value, encoding errors due to the error operation of a slave latch can be avoided.

A twelfth solving means shows an analog-digital converter of the sixth solving means, wherein potentials of the pair of inputs of the slave latch provided on the output side of each folding circuit are offset so that the amplitude level of a non-inverted output signal agrees with that of an inverted output signal.

Since the non-inverted outputs and the inverted outputs output from the folding circuits have the same amplitude level, this allows a slave latch to operate smoothly.

A thirteenth solving means shows an analog-digital converter of the sixth, seventh, or eighth solving means, wherein a pre-amplifier is provided so that the difference voltage between a reference voltage and an analog input voltage is amplified and fed to each master-comparator latch.

Since the difference voltage between Vr and Vin is amplified by a pre-amplifier, high-accuracy can be obtained even in a high-speed ADC.

PREFERRED EMBODIMENTS OF THE INVENTION

With reference to the drawings, preferred embodiments of the invention are now described.

First Embodiment

Figure 1:
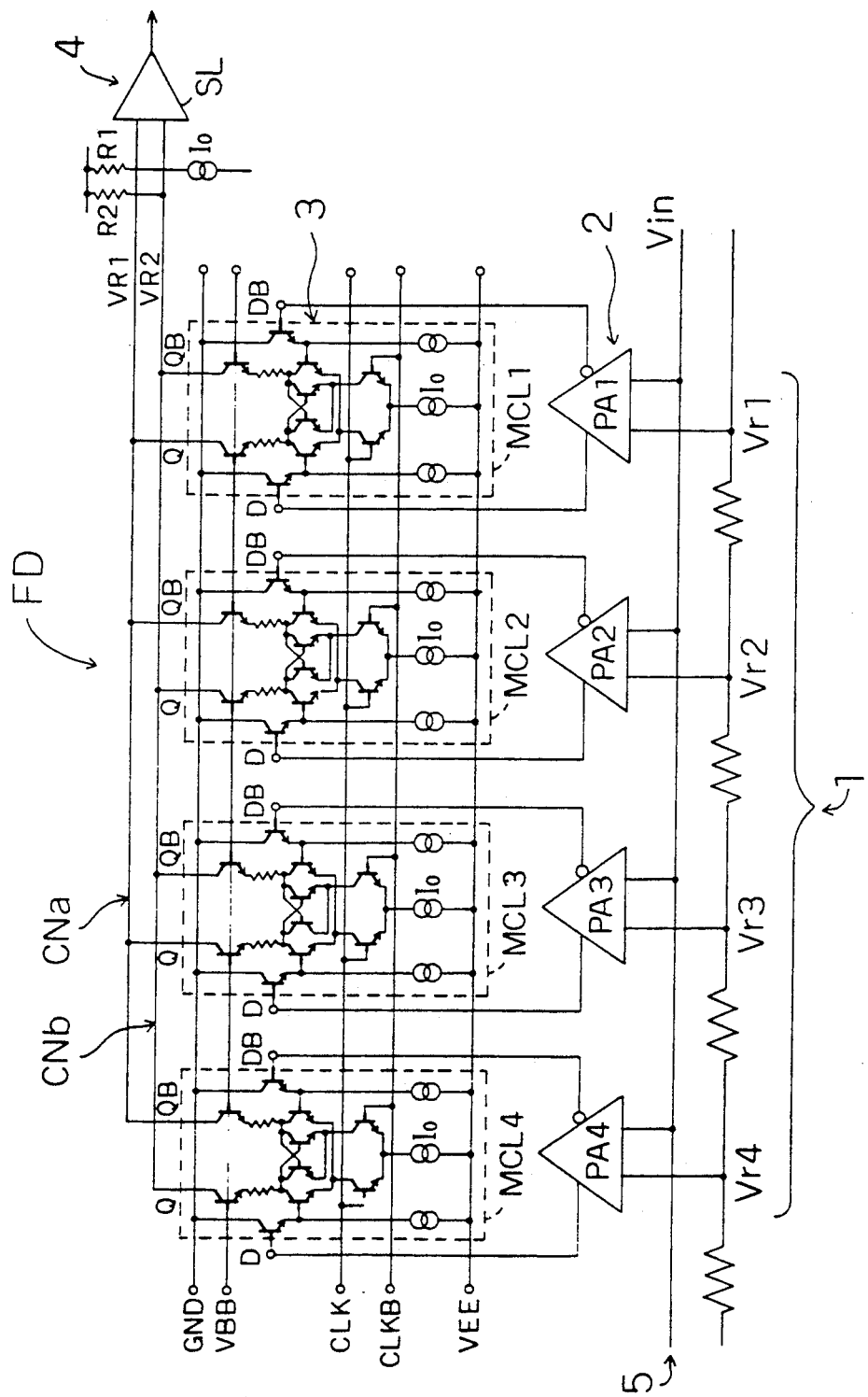
FIG. 1 is a wiring diagram of a folding circuit of a first embodiment.

FIG. 1 shows a folding circuit (FD) of a first embodiment in which the output currents of four master-comparator latches are superimposed. This folding circuit FD comprises (a) a reference resistor row 1, formed by four reference resistors connected in series, which generates four different reference voltages Vr1 to Vr4, (b) a pre-amplifier array 2 formed by four pre-amplifiers PA1 to PA4, (c) a master-comparator latch array 3 formed by four master-comparator latches MCL1 to MCL4, (d) a slave latch (SL) 4 functioning as a load, and (e) a signal input terminal 5 through which an analog voltage signal Vin is applied. Resistors R1 and R2 are used to convert current signals into voltage signals.

One input of each PA is connected to the signal input terminal 5 for the application of Vin, while the other input is connected between the reference resistors of the reference resistor row 1 for the application of Vr resulting from voltage-division by the reference resistors ($Vr1 < Vr2 < Vr3 < Vr4$). Each PA makes a comparison between Vin and Vr and amplifies the difference voltage between them for outputting.

Each MCL has a pair of inputs connected to a pair of outputs of each PA for the input of such a difference voltage. Each MCL contains a differential amplifier, makes a comparison between Vin and Vr during the comparison mode, and provides, during the latch mode, a positive feedback to a differential voltage produced during the comparison mode for latching. The differential current generated in each of MCL1 to MCL4 is drawn by means of cascode connection to common-base transistors.

The non-inverted output Q of MCL1, the inverted output QB of MCL2, the non-inverted output Q of MCL3, and the inverted output QB of MCL4 are fed to wiring CNa connected to the resistor R1. Meanwhile, the inverted output QB of MCL1, the non-inverted output Q of MCL2, the inverted output QB of MCL3, and the non-inverted output Q of MCL4 are fed to wiring CNb connected to the resistor R2. To sum up, this means that the non-inverted output Q and the inverted output QB are alternately drawn from each MCL, superimposed and fed into a pair of inputs of the slave latch 4. The wirings CNa and CNb together constitute a pair of wiring means. The resistor R1 is biased by the same current source that is used for the master-comparator latches (if the number of master-comparator latches is odd, this eliminates the need for connection to the current source). The folding circuit FD is composed of the master-comparator latches MCL1 to MCL4, the wirings CNa and CNb, and the slave latch 4.

In this embodiment, the outputs of four master-comparator latches are fed to a single slave latch. It is possible to employ two slave latches so that the outputs of two of the four master-comparator latches are fed to one of the two slave latches while the outputs of the remaining master-comparator latches are fed to the remaining slave latch. This means that two folding circuits are provided.

The resistors R1, R2 and the slave latch 4 are provided to serve as a load. A slave latch of the current comparison type requires none of the resistors R1 and R2. In the case of a comparator latch not employing a master/slave configuration, no slave latches are required. When using a slave latch, the resistor can be replaced by a transistor or the like element.

Figure 2:
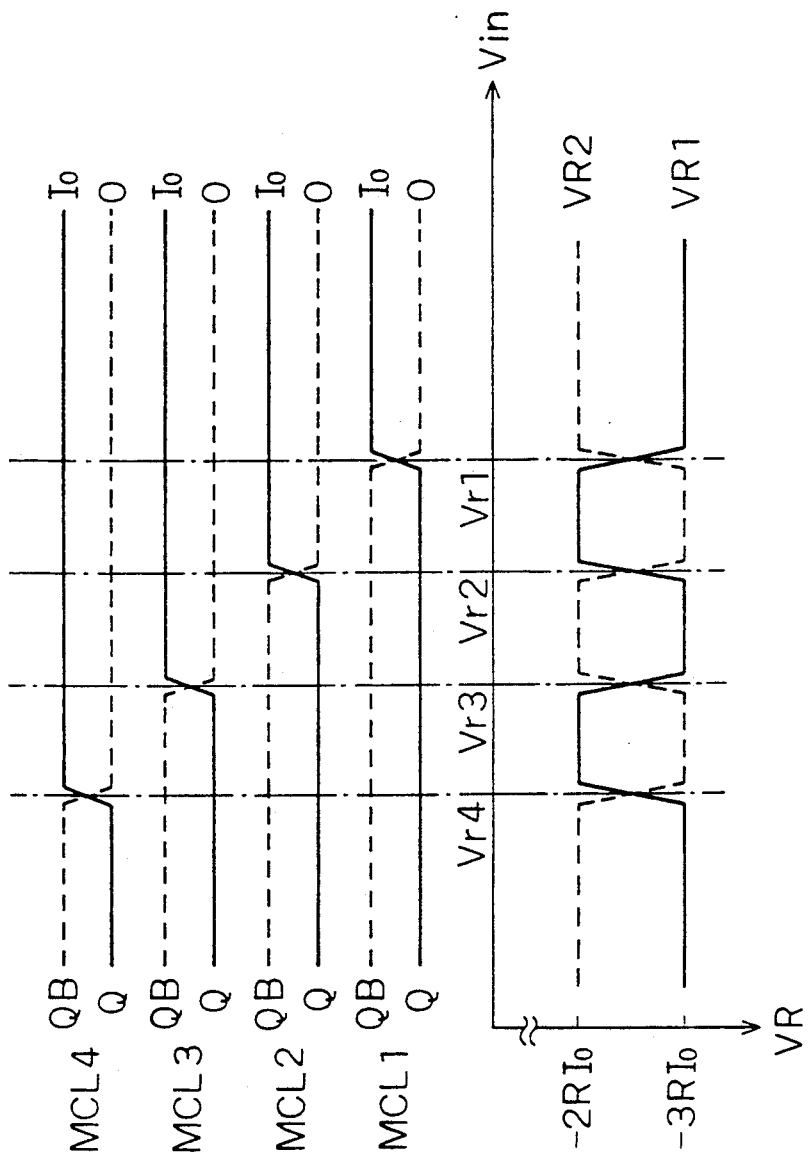
FIG. 2 shows a waveform of a folded signal output from the folding circuit of FIG. 1.

The above-described folding circuit is detailed. Now suppose that Vin is lower than Vr4, i.e., the reference voltage of MCL4, a current flows through the side of the inverted output QB of each MCL in the latch mode. If the current value of a constant current source of the master-comparator latch array 3 is I0, a current of 2I0 flows through the resistor R2 while a current of 3I0 in total, including a current of I0 of the constant current source connected to the resistor R1, flows through the resistor R1. When Vin exceeds Vr4, the output of MCL4 is reversed, and current switching takes place between the resistors R1 and R2 so that a current of 2I0 now flows through resistor R1 while a current of 3I0 flows through resistor R2. If Vin exceeds Vr3, the output of MCL3 is reversed. Current switching then takes place again, but in an opposite direction to the earlier switching. Now a current of 2I0 flows through the resistor R2 and a current of 3I0 flows through the resistor R1. Voltages VR1 and VR2, generated in the resistors R1 and R2, vary with respect to Vin as shown in FIG. 2. If Vr4<Vin<Vr3, and if Vr2<Vin<Vr1, VR1 goes HIGH, otherwise it goes LOW. VR1 varies and makes a turn at points where Vin exceeds Vr. As seen from the figure, if the number of master-comparator latches is even, the output becomes symmetric in a direction of Vin, or if the number of master-comparator latches is odd, it becomes asymmetric.

As shown in FIG. 1, a folding circuit of the invention has a configuration in which the non-inverted outputs and the inverted outputs of the master-comparator latches are drawn alternately in the order of magnitude of the reference voltages of the master-comparator latches for superimposition. The output current of each MCL is a digital current so that it flows either through the non-inverted output Q side or through the inverted output QB side at a time in the latch mode. In other words, if current flows thorough the Q side, no current will flow through the QB side, or vice versa. Accordingly, an ideal waveform which takes a sharp turn at each Vr transition point is obtained in the latch mode. Even though the potential difference between Vr's of the master-comparator latches is smaller than the saturation voltage of a differential amplifier, a waveform with a perfect turn is obtained in the latch mode. Additionally, voltages obtained are differential ones, thereby presenting several advantages such as a high-speed, noise-resistance operation. The output of the slave latch 4, supplied with an input in the form of such an output waveform, becomes digital data over a clock cycle. This is very beneficial to achieving a high-speed encoder.

Second Embodiment

Figure 3:
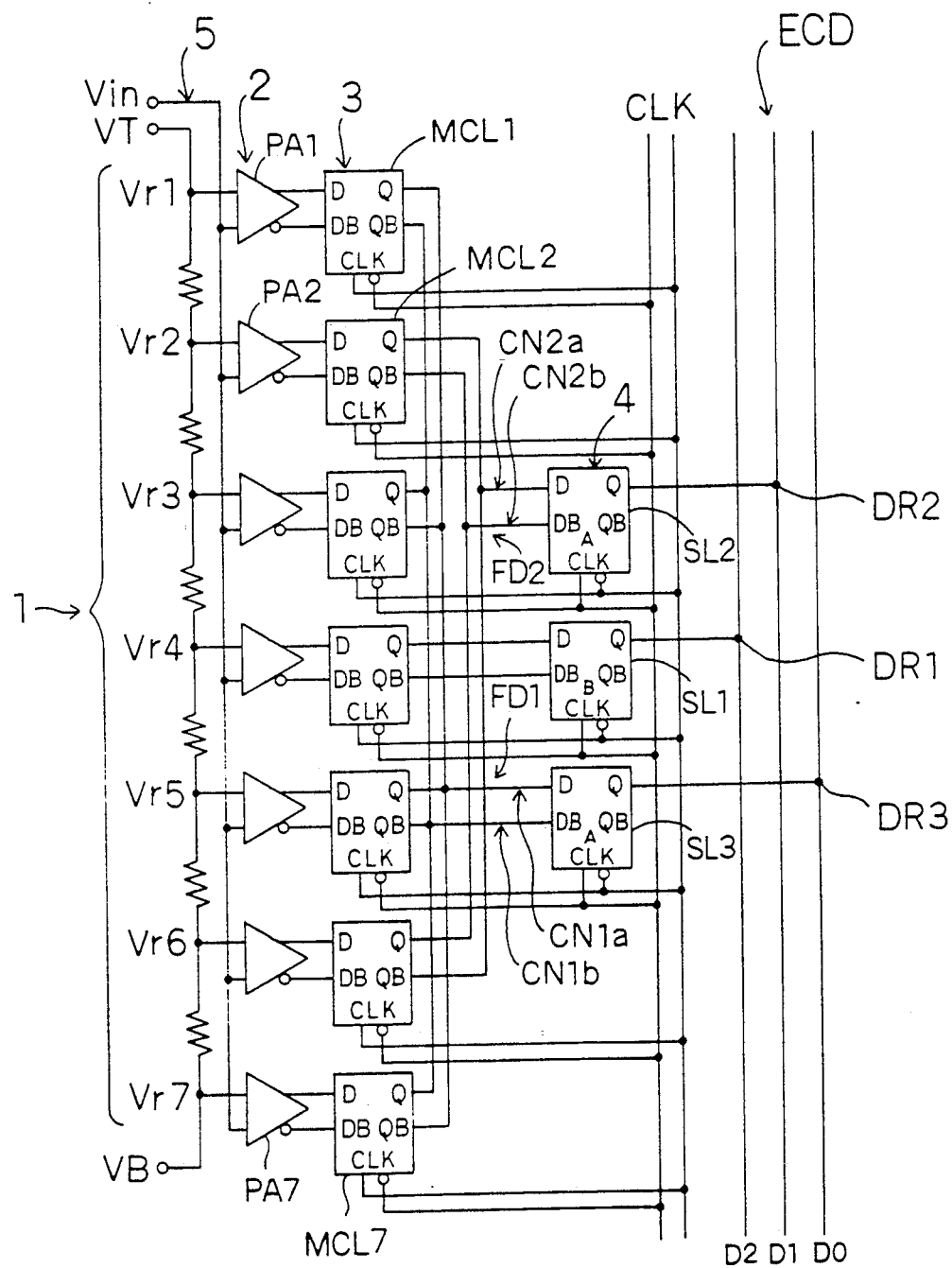
FIG. 3 is a wiring diagram of an ADC of a second embodiment which outputs a 3-bit digital signal.

A second embodiment is now described. FIG. 3 shows an ADC of this embodiment. In this ADC, the combination of master-comparator latches is made so as to correspond to the transitions of codes used for an encoder ECD to perform direct encoding with the output of a slave latch, and 3-bit Gray codes are generated. This ADC comprises (a) a reference resistor row 1 for generating reference voltages Vr1 to Vr7, which is formed by seven reference resistors, (b) a pre-amplifier array 2 formed by seven pre-amplifiers PA1 to PA7 which are supplied with Vr, and Vin through a signal input terminal 5, (c) a master-comparator latch array 3 formed by seven master-comparator latches MCL1 to MCL7 which are supplied with the outputs of PA1 to PA7, and (d) a slave latch array 4 formed by three slave latches SL1 to SL3.

Figure 10:
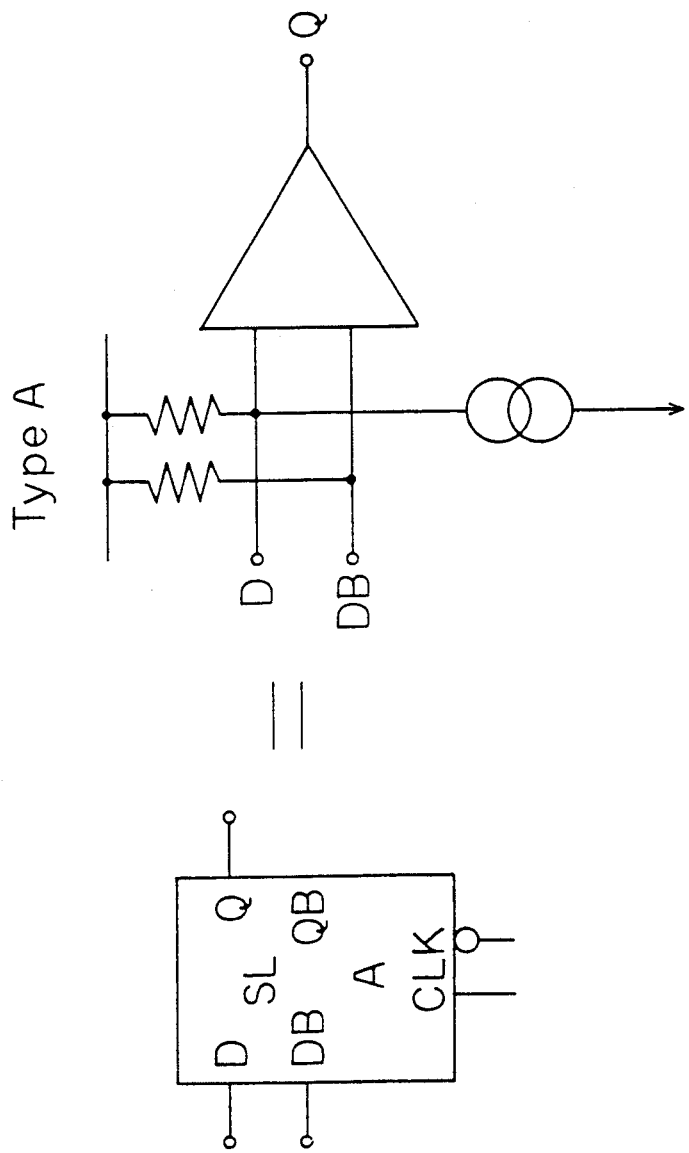
FIG. 10 is a wiring diagram of a slave latch.
Figure 11:
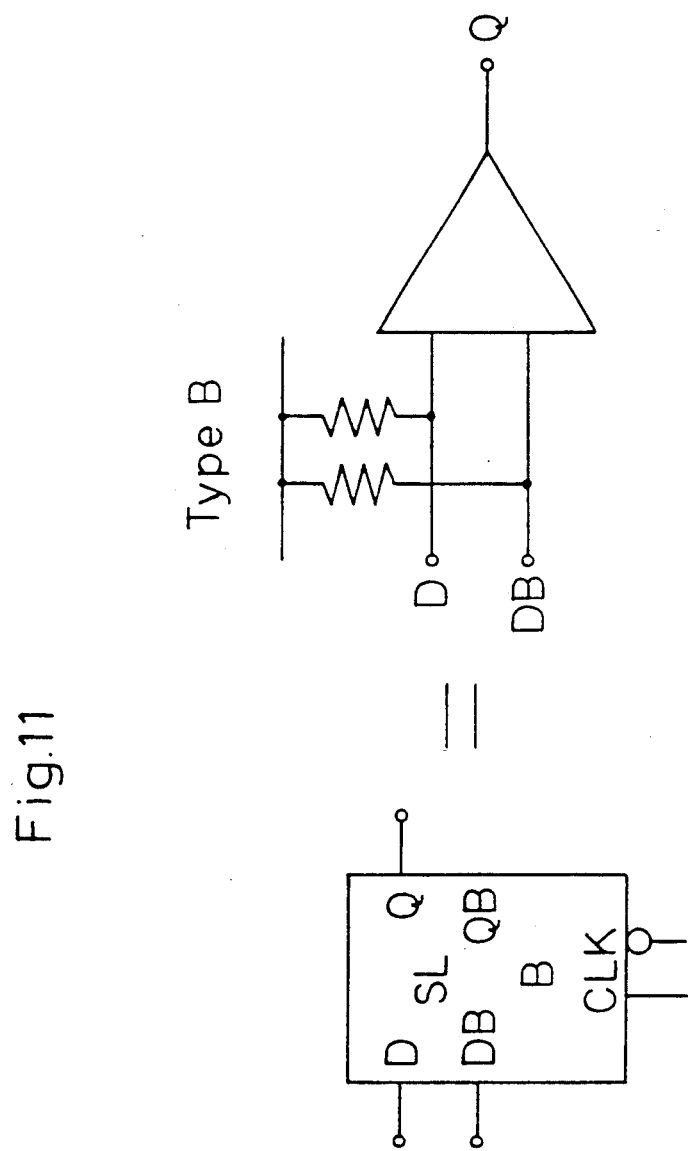
FIG. 11 is a wiring diagram of another slave latch.

The outputs of SL1 to SL3 are used to encode a digital signal formed by three bits from D0 to D2. SL3, which encodes the least significant bit (LSB) D0, is supplied with a signal formed by superimposing the outputs of MCL1, MCL3, MCL5, and MCL7 corresponding to the code transitions of the least significant bit of a Gray code, via wirings CN1a and CN1b. A folding circuit FD1 is composed of MCL1, MCL3, MCL5, MCL7, CN1a, CN1b, and SL3. SL2, which encodes the second bit D1 from LSB, is supplied with a signal formed by superimposing the outputs of MCL2 and MCL6 via wirings CN2a and CN2b. A folding circuit FD2 is composed of MCL2, MCL6, CN2a, CN2b, and SL2. SL1, which encodes the most significant bit D2, is exclusively supplied with the output of MCL4. The outputs of the above-described plural master-comparator latches are superimposed and fed into a slave latch. More specifically, the non-inverted outputs and the inverted outputs of the master-comparator latches are alternately drawn in the order of magnitude of the reference voltages and fed into each slave latch as its non-inverted input D and inverted input DB. FIG. 10 shows a configuration of SL2 and SL3 (offset type). FIG. 11 shows a configuration of SL1 (non-offset type).

The outputs of SL1 to SL3 are fed to the encoder ECD for encoding of a signal formed by three bits D0, D1, and D2. The output of SL1 is connected to the encoder line of the most significant bit D2 via a dotting transistor DR1. The output of SL2 is connected to the encoder line of the second bit D1 from LSB via a dotting transistor DR2. The output of SL3 is connected to the encoder line of the least significant bit D0 via a dotting transistor DR3.

Figure 4:
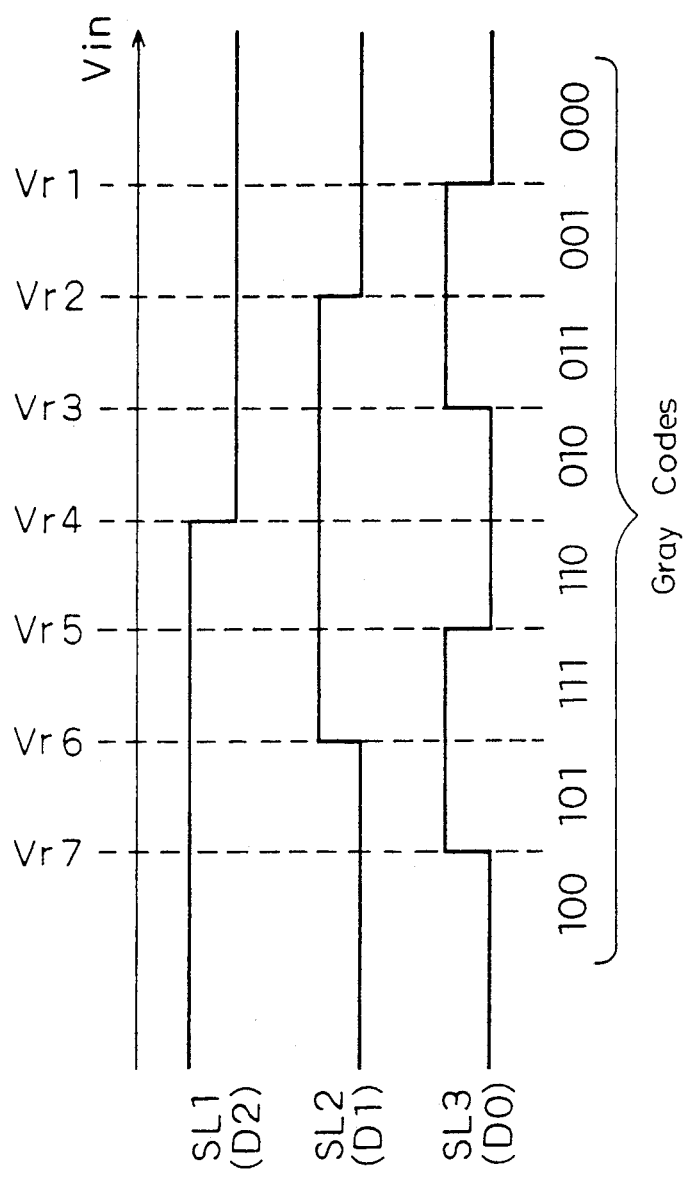
FIG. 4 shows a waveform of a digital signal by which a 3-bit Gray code generated by the ADC of FIG. 3 is encoded.

The outputs of SL1, SL2, and SL3 vary with respect to Vin, which is shown in FIG. 4. The output of SL3 corresponding to the least significant bit D0 goes HIGH if Vr7<Vin<Vr5, and if Vr3<Vin<Vr1. The output of SL2 corresponding to the second bit D1 goes HIGH if Vr6<Vin<Vr2. The output of SL1 corresponding to the most significant bit D2 goes HIGH if Vin<Vr4.

Accordingly, 000 is encoded if Vin>Vr1. 001 is encoded if Vr1>Vin>Vr2. 011 is encoded if Vr2>Vin>Vr3. 010 is encoded if Vr3>Vin>Vr4. 110 is encoded if Vr4>Vin>Vr5. 111 is encoded if Vr5>Vin>Vr6. 101 is encoded if Vr6>Vin>Vr7. 100 is encoded if Vin>Vr7. This shows that only one bit position is changed at a time.

A Gray code signal is then converted into a binary code signal with a code converter (not shown). Such a code converter may not be always needed. A Gray code signal may be used directly without a further conversion.

A conventional ADC presents several disadvantages, one of which is that the number of slave latches must be equal to the number of master-comparator latches because the output of one master-comparator latch is designed to be received by one slave latch. Conversely, the present ADC makes use of two folding circuits whereby the outputs of plural master-comparator latches are superimposed and connected to a single slave latch. This reduces the slave latch count.

Figure 15:
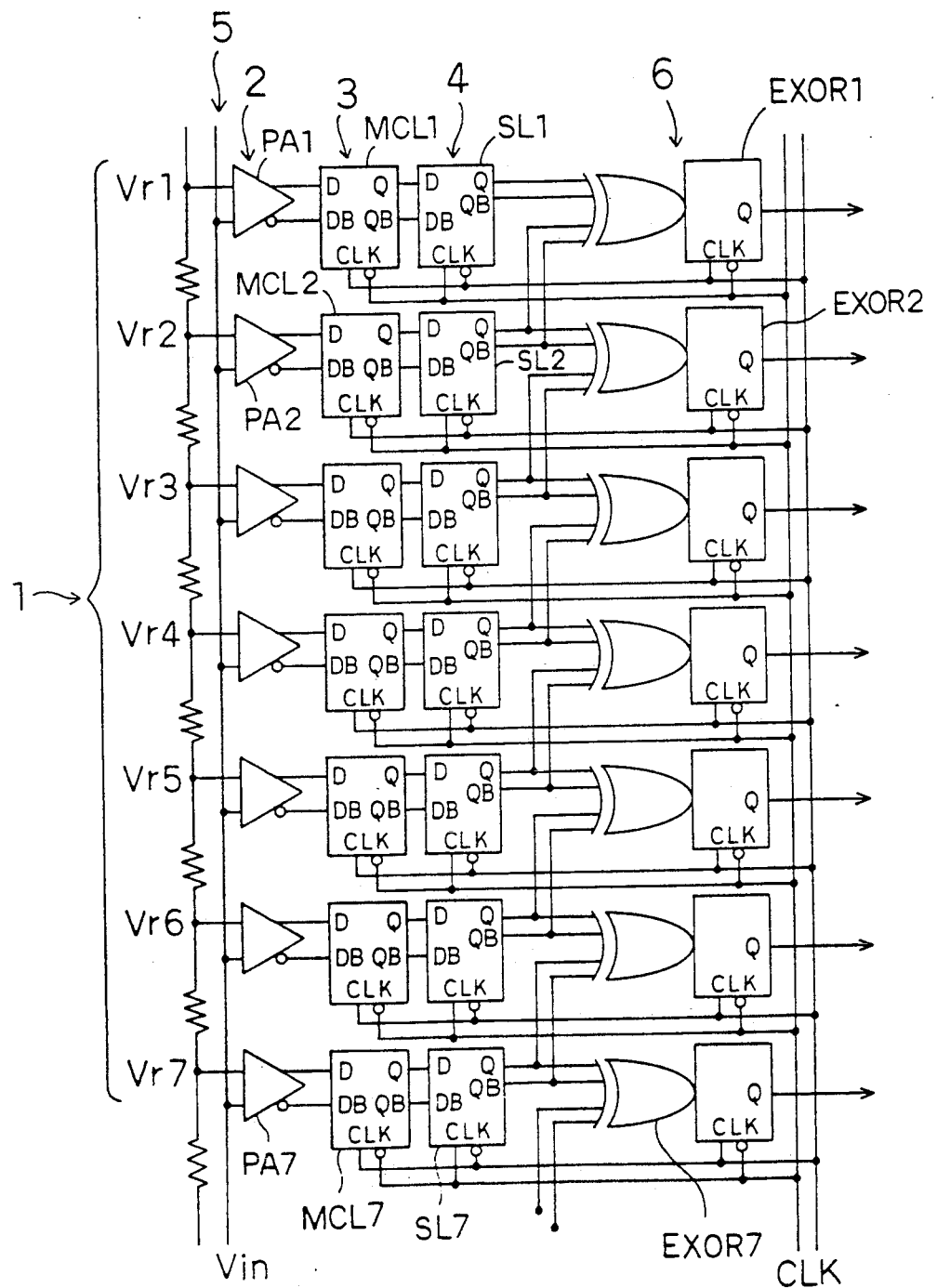
FIG. 15 is a wiring diagram of a conventional ADC formed of comparators having a conventional master/slave latch configuration.

Further, the process of encoding is directly carried out with the output of a slave latch, thereby eliminating the need for an XOR operation between outputs of slave latches. This means that no XOR gates are needed. When taking a 3-bit analog-to-digital conversion into consideration, a conventional technique requires seven master-comparator latches, seven slave latches, and seven XOR gates, which totals 21 gates, as shown in FIG. 15. In accordance with the present invention, only ten gates (seven master-comparator latches plus three slave latches) are required, which is about half of the gate count required for the conventional technique.

Figure 5:
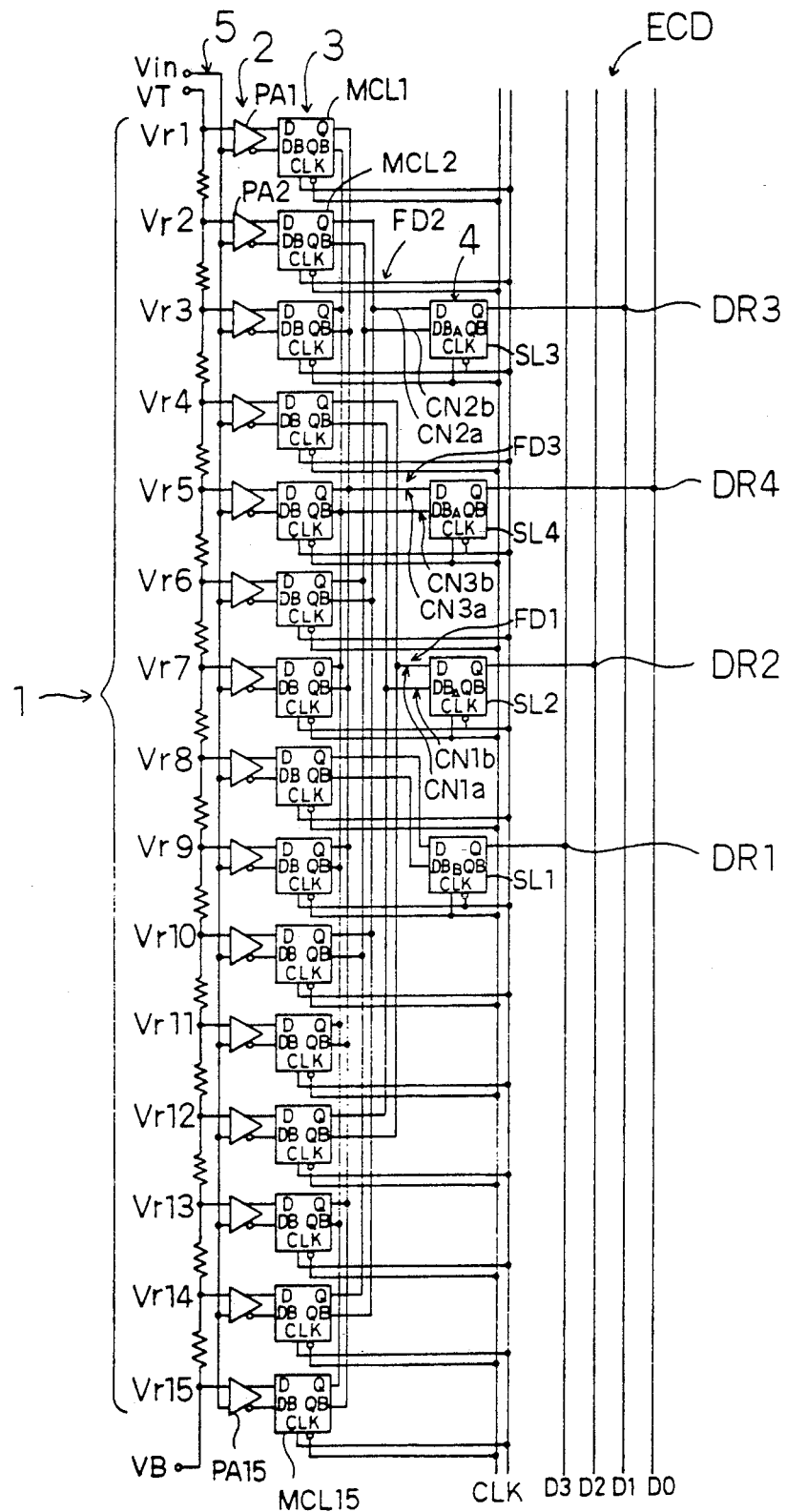
FIG. 5 is a wiring diagram of an ADC of the second embodiment which outputs a 4-bit digital signal.

In the foregoing description, the process of encoding a 3-bit digital signal is explained. This, however, is not to be considered restrictive. This embodiment may be applicable to an ADC that outputs a digital signal formed by 4 or more bits. A conventional 4-bit ADC requires 15 master-comparator latches, 15 slave latches, and 15 XOR gates, that is, 45 gates are needed in total. In accordance with the invention, only 19 gates (15 master-comparator latches and 4 slave latches) are required, as shown in FIG. 5. Take an n-bit ADC, for example. The present invention results in the reduction of $(2^n-1-n)$ slave latches, and in the reduction of $(2^n-1)$ XOR gates. This leads to remarkably reducing the element count and achieving lower power consumption. Further the area of a chip is used effectively.

FIG. 5 shows an ADC that performs 4-bit encoding. This ADC comprises (a) a reference resistor row 1 for generating $(2^4-1)$ reference voltages, namely Vr1 to Vr15, (b) a pre-amplifier array 2 formed by 15 pre-amplifiers PA1 to PA15 which are supplied with Vr, and Vin from a signal input terminal 5, (c) a master-comparator latch array 3 formed by 15 master-comparator latches MCL1 to MCL15 which are supplied with the outputs of the pre-amplifier PA1 to PA15, and (d) a slave latch array 4 formed by four slave latches SL1 to SL4. A signal of four bits D0, D1, D2 and D3 is directly encoded with an encoder ECD according to the output of each slave latch. The outputs of the odd-numbered master-comparator latches, i.e., MCL1, MCL3, MCL5, MCL7, MCL9, MCL11, MCL13, and MCL15 are superimposed and fed into SL4 which encodes the least significant bit D0. The outputs of MCL2, MCL6, MCL10, and MCL14 are superimposed and fed into SL3 that encodes the second bit D1 from LSB. The outputs of MCL4 and MCL12 are superimposed and fed into SL2 that encodes the third bit D2 from LSB. The output of MCL8 is exclusively fed into SL1 that encodes the most significant bit D3. The opposite-phase outputs of the master-comparator latches excluding MCL8 are sequentially superimposed in the order in which Vr descends and then fed into the slave latches excluding SL1 as their non-inverted inputs D and inverted inputs DB, via wirings, i.e., CN1*a*, CN1*b*, CN2*a*, CN2*b*, CN3*a*, and CN3*b*. The ADC of FIG. 5 has three folding circuits, FD1, FD2, and FD3. The output of each slave latch is fed to the encoder. The encoder encodes four bits from the most significant bit D3 to the least significant bit D0 through the dotting transistors DR1 to DR4, according to the output of each slave latch.

Figure 6:
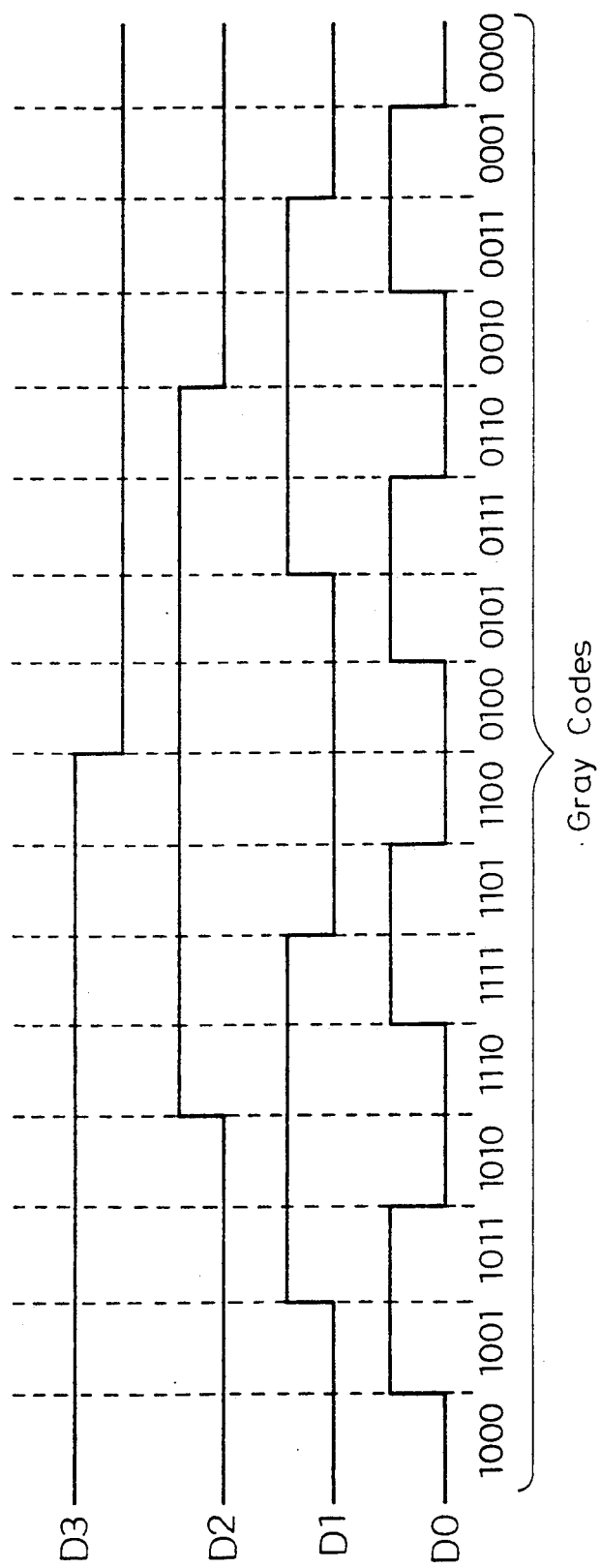
FIG. 6 shows a waveform of a digital signal by which a 4-bit Gray code generated by the ADC of FIG. 5 is encoded.

With this configuration, a digital signal is encoded as Gray codes of 1000, 1001, 1011, 1010, 1110, 1111, 1101, 1100, 0100, 0101, 0111, 0110, 0010, 0011, 0001, and 0000 (see FIG. 6). The same operation as the above can be obtained.

In this embodiment, a digital signal entirely represented by Gray codes is encoded with the output of a slave latch. This, however, is not to be considered restrictive. With regard to a code in which a signal transition does not overlap on another, the generation of any pattern is possible.

Third Embodiment

Figure 7:
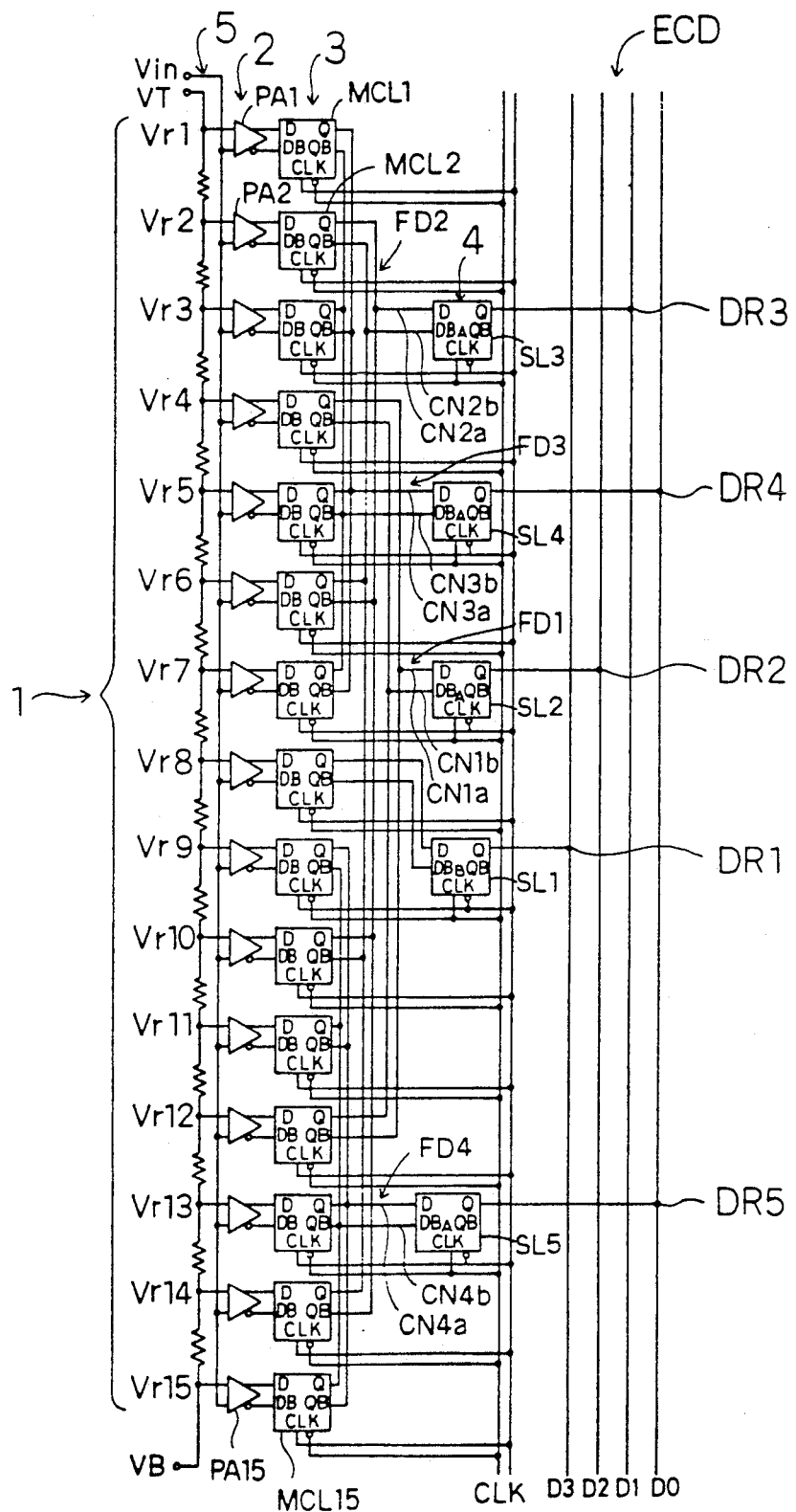
FIG. 7 is a wiring diagram of an ADC which outputs a 4-bit digital signal while at the same time limiting the number of master-comparator latches of a third embodiment.

In the foregoing second embodiment, an ADC composed of a minimum number of slave latches is described. As the number of master-comparator latches increases in a folding circuit, the amplitude level declines. As a result, a greater amplitude can not be obtained. To cope with this problem, the number of master-comparator latches may be limited. FIG. 7 illustrates an ADC of a third embodiment. For the case of a 4-bit signal, the master-comparator latch count is limited to four at the most in this embodiment. A folding circuit FD, used to encode the least significant bit D0, is divided into two.

Five slave latches SL1 to SL5 and 15 master-comparator latches MCL1 to MCL15 are provided. The outputs of MCL1, MCL3, MCL5, and MCL7 are superimposed and then fed into SL4 via wirings, CN3*a* and CN3*b*. The outputs of MCL9, MCL11, MCL13, and MCL15 are superimposed and fed into SL5 via wirings, CN4*a* and CN4*b*. In other words, the folding circuit FD3 of FIG. 5 is divided so as to form two folding circuits. An encoder ECD is provided with dotting transistors DR1 to DR5. This encoder ECD encodes the least significant bit D0 via transistors DR4 and DR5. Other configurations are the same as those of FIG. 5. Like FIG. 6, a 4-bit digital signal represented by Gray codes is obtained by means of the bits D0 to D3 (not shown).

Although the slave latch count increases as compared to the second embodiment, the output amplitude can be kept at an adequate value. Accordingly, error operations due to the output amplitude being insufficient can be effectively prevented.

Fourth Embodiment

A fourth embodiment is now described. As seen from FIGS. 3 and 5, as resolution becomes high (that is, as the number of bits increases), the number of wirings increases. Wiring therefore requires much more area. The distance between master-comparator latches becomes greater exponentially as the bit moves to a high-order position. Due to this, a high-resolution, high-speed ADC is most likely to suffer conversion errors with respect to high-order bits. In this embodiment, the process of encoding is divided into two, high-order coding and low-order coding. In the high-order coding, an XOR signal, obtained by connecting the non-inverted outputs to the inverted outputs of the master-comparator latches in order, is fed to slave latches, and the output of each slave latch is dealt with by each dotting transistor. The low-order coding is carried out in the same way as in the third embodiment.

Figure 8:
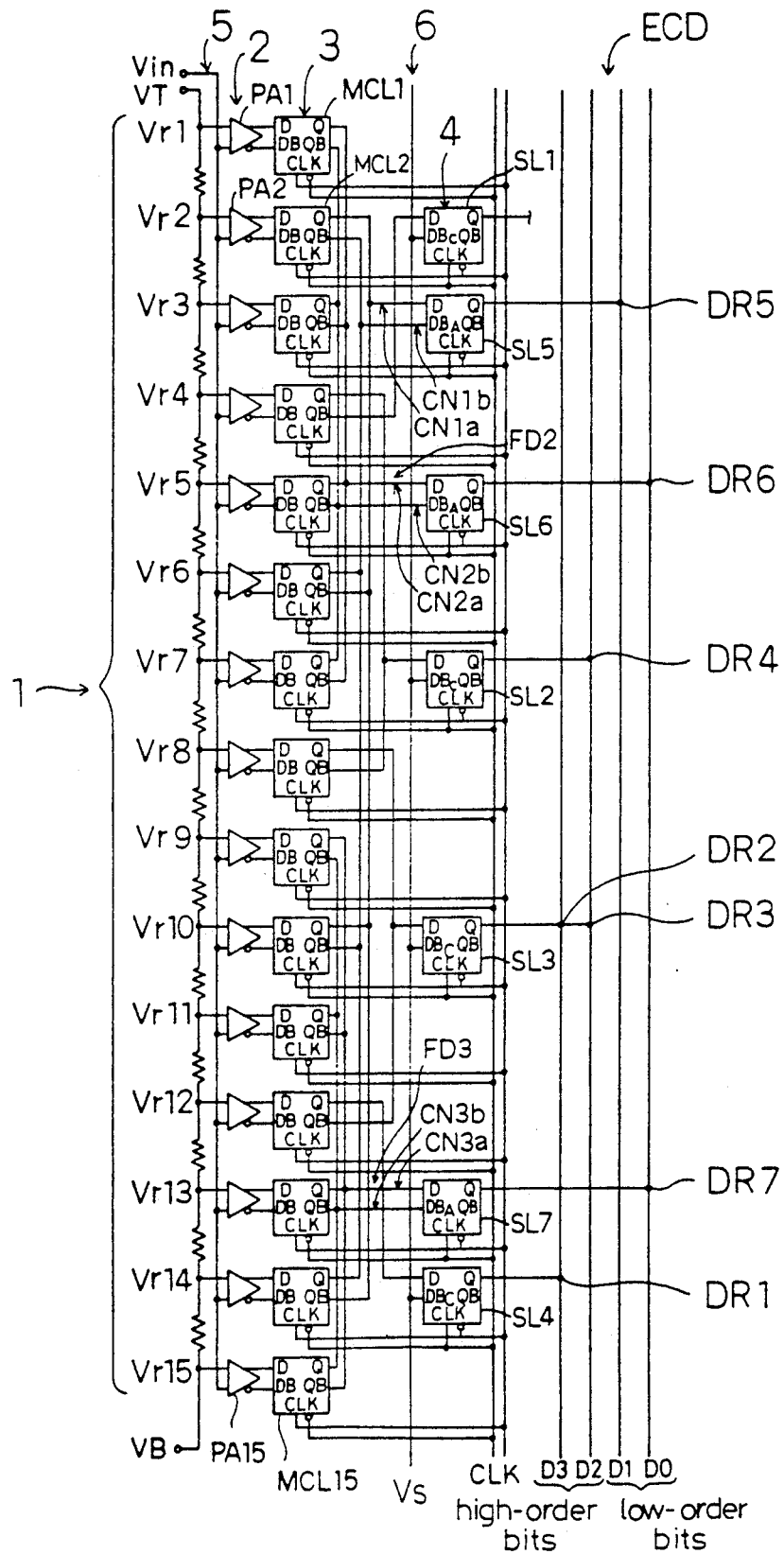
FIG. 8 is a wiring diagram of an ADC of a fourth embodiment in which folding circuits are provided only for low-order bits.

In the case of encoding a digital signal of 4-bits, SL1 to SL7 and MCL1 to MCL15 are provided as shown in FIG. 8. As shown in this figure, the least significant bit D0 is directly converted into a digital signal represented by Gray codes via FD2 and FD3, and DR6 and DR7, while the second bit D1 from LSB is directly converted into a digital signal by means of Gray codes via FD1, and DR5.

Figure 9:
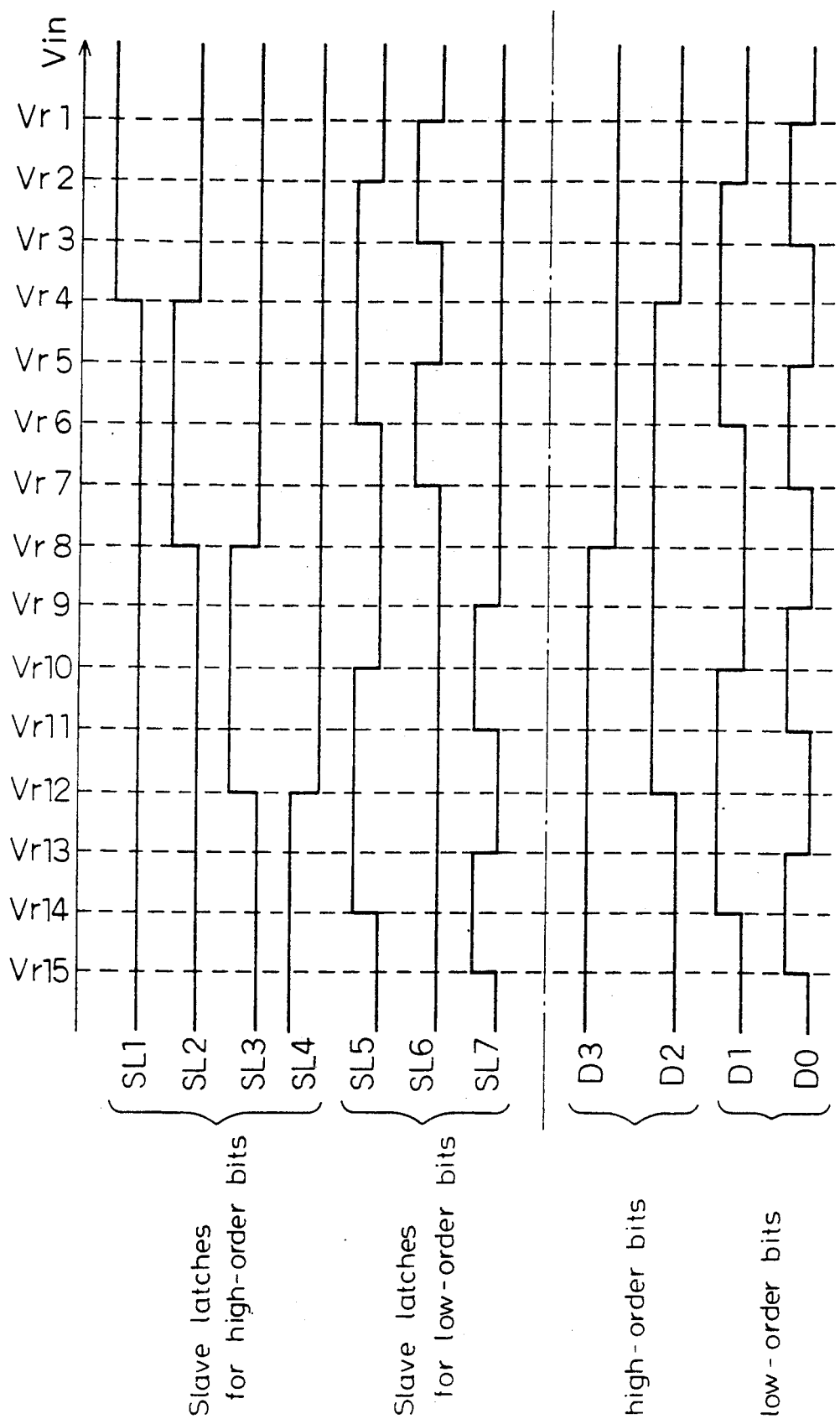
FIG. 9 shows a waveform of a 4-bit digital signal generated by the ADC of FIG. 8.
Figure 12:
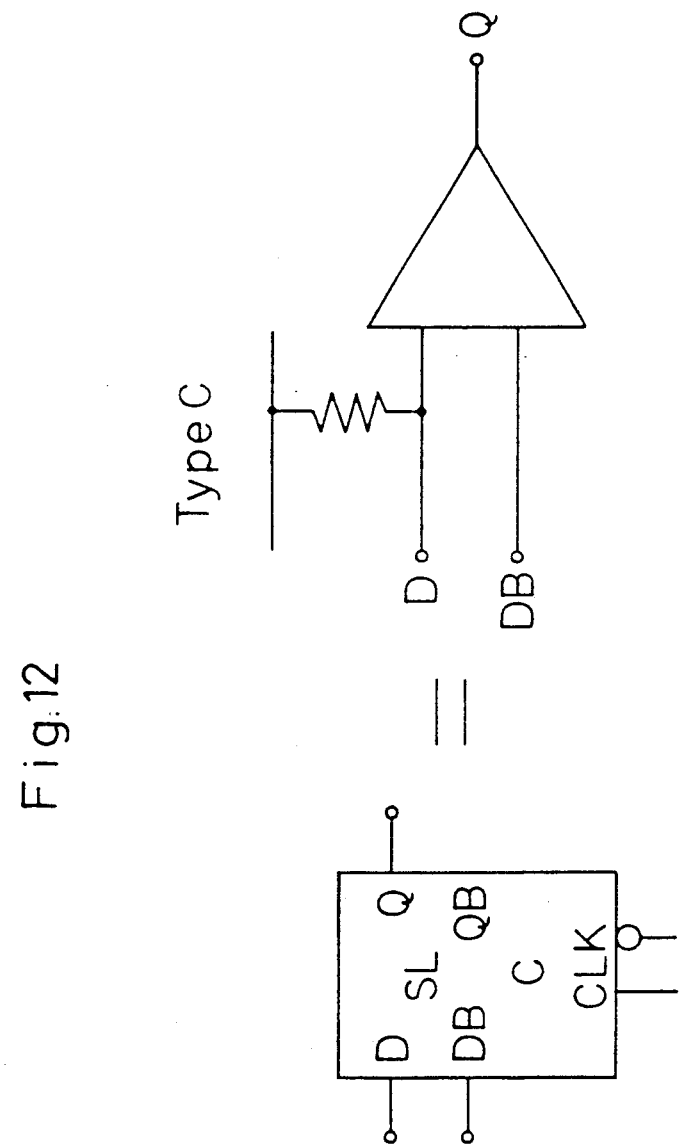
FIG. 12 is a wiring diagram of still another slave latch.
Figure 13:
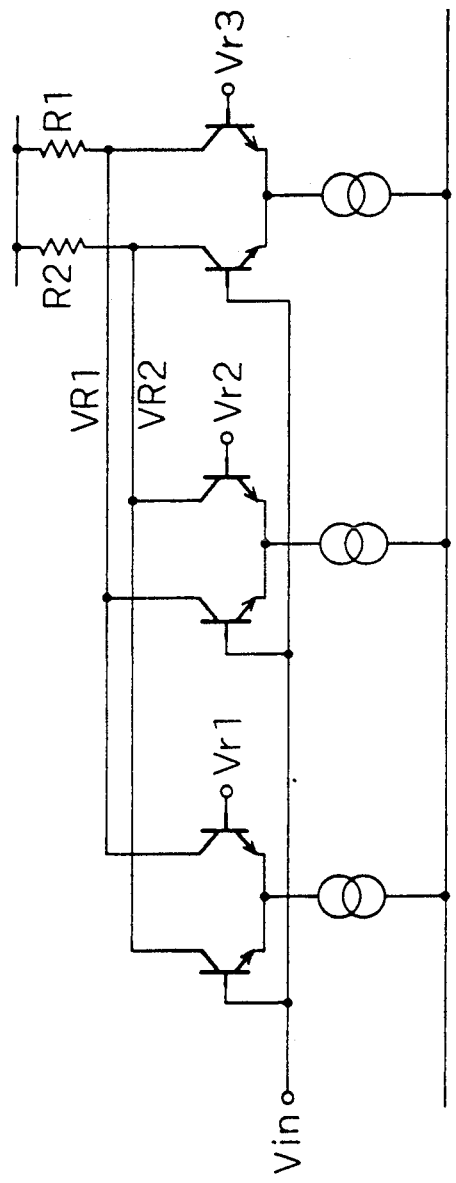
FIG. 13 is a wiring diagram of a conventional folding circuit.
Figure 14:
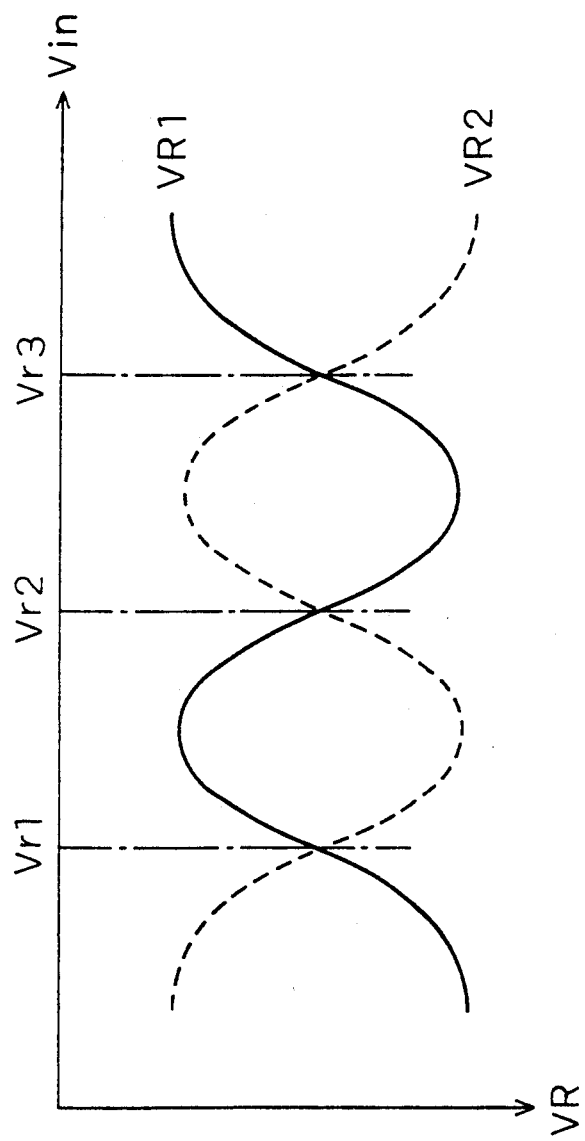
FIG. 14 shows a waveform of a folded signal generated by the conventional folding circuit of FIG. 13.

The most significant bit D3 and the third bit D2 from LSB are encoded as follows. Among MCL4, MCL8, and MCL12 corresponding to the transitions of D2 and D3, the non-inverted output Q of a master-comparator latch having a higher potential is sequentially connected to the inverted output QB of another master-comparator latch having a next higher potential. The configuration of SL1 to SL4, each of which receives an XOR output between output signals of the master-comparator latches through one input thereof, is shown in FIG. 12. A reference voltage Vs is applied to each slave latch through the other input. For example, when Vin is: $Vr8 < Vin < Vr4$, a current flows through the inverted output QB side of MCL4 as well as through the non-inverted output QB side of MCL4 as well as through the non-inverted output Q sides of MCL8 and MCL12. This causes only SL2 to go HIGH, and the others go LOW. This means that the XOR operation between output signals of the master-comparator latches is executed. FIG. 9 shows an output waveform of each slave latch and a waveform of each bit. Like FIG. 6, digital signals, represented by means of Gray codes, are obtained through DR1 to DR4 with the encoder ECD.

In this embodiment, the high-order codes of a digital output signal are encoded by the output signal of a slave latch supplied with an XOR between output signals of master-comparator latches. Because of this, even if the bit count increases, error conversions due to the increased distance between master-comparator latches can be avoided. This results in remarkably reducing the element count and achieving less power consumption. Further, the area of a chip is used effectively while maintaining reliability.

Further, in each embodiment, a pre-amplifier array is provided. Such a pre-amplifier array may not be required always, although a high-speed conversion and high-accuracy operation may be achieved by the provision of a pre-amplifier array.

The invention claimed is:

1. A folding circuit which comprises:
   a plurality of comparator latches each having a pair of inputs, which are fed common analog input voltage signals through one input and different reference voltages sequentially set at predetermined intervals through the other input, each of said comparator latches making a comparison between an analog input voltage signal and a reference voltage during a comparison mode, providing a positive feedback to difference voltages resulting from the comparison and performing latch action during a latch mode, and outputting currents as a non-inverted output and an inverted output from a pair of outputs of each comparator latch,
   a load element which is simultaneously fed differential current outputs of each of said comparator latches through a pair of inputs thereof, and
   a pair of wiring means through which the non-inverted outputs and the inverted outputs of each of said comparator latches, drawn alternately in the order of magnitude of the reference voltages inputted to each of said comparator latches and superimposed, are connected to the pair of inputs of the load element,
   whereby the analog input voltage signals are converted into folded signals at each of said reference voltage intervals.

2. The folding circuit as in claim 1 wherein a preamplifier is provided so that the difference voltage between a reference voltage and an analog input voltage signal is amplified and fed to each of said comparator latches.

3. The folding circuit as in claim 1 or claim 2, wherein said load element is a resistor to convert a current signal into a voltage signal.

4. The folding circuit as in claim 1 or claim 2, wherein said comparator latches are master-comparator latches and said load element is a slave latch of a current comparison type.

5. The folding circuit as in claim 1 or claim 2, wherein said comparator latches are master-comparator latches, and said load element comprises a resistor to convert a current signal into a voltage signal and a slave latch of a voltage comparison type connected to said resistor in parallel.

6. An analog-digital converter which comprises:
   a plurality of comparators each having a pair of inputs, which are fed common analog input voltage signals through one input and different reference voltages sequentially set at predetermined intervals through the other input, and
   an encoder which is fed outputs of said comparators so as to encode a digital signal,
   wherein:
   some of said comparators are formed into a group and composed of a plurality of master-comparator latches, each of said master-comparator latches making a comparison between an analog input voltage signal and a reference voltage during a comparison mode, providing a positive feedback to difference voltages resulting from the comparison, performing latch action during a latch mode, and outputting currents as a non-inverted output and an inverted output from a pair of outputs of each master-comparator latch, and a slave latch with a pair of inputs which is fed differential current outputs of each of said master-comparator latches through the pair of inputs,
   a pair of wiring means are provided through which the non-inverted outputs and the inverted outputs of each of said master-comparator latches, drawn alternately in the order of magnitude of the reference voltages inputted to each of said master-comparator latches and superimposed, are connected to the pair of inputs of said slave latch,
   whereby a folding circuit, composed of said master-comparator latches, said pair of wiring means, and said slave latch, converts the analog input voltage signals into folded signals at each of said reference voltage intervals.

7. The analog-digital converter as in claim 6, wherein:
said master-comparator latches are arranged at positions corresponding to code transitions of a digital output signal,
the number of said slave latches is at least equal to a number of bits of said digital output signal, and
said encoder performs direct encoding with an output of said slave latch.

8. The analog-digital converter as in claim 7, wherein:
at least one folding circuit is provided to each bit excluding the most significant bit of the digital output signal,
a master-comparator latch in a folding circuit that encodes the least significant bit is arranged so that a folded signal is folded periodically for every two reference voltage intervals,
a master-comparator latch in a folding circuit that encodes a particular bit higher than the least significant bit is arranged so that a folded signal is folded in a double cycle at a mid-point between folded points of a folded signal outputs from a folding circuit that encodes a bit lower than the particular bit by one bit, and
said encoder encodes a digital signal represented by Gray codes.

9. The analog-digital converter of claim 6, claim 7 or claim 8, wherein:
the digital output signal is divided into a high-order code and a low-order code, and
a slave latch that encodes the high-order codes is fed a signal formed by an XOR between outputs of the master-comparator latches corresponding to transitions of the high-order codes, while a slave latch that encodes the low-order codes is fed an output of the folding circuit.

10. The analog-digital converter as in claim 6, wherein:
said slave latch is a slave latch of a voltage comparison type and has a pair of inputs, and
a pair of resistors that convert a current signal into a voltage signal are connected in parallel to said pair of inputs of said slave latch.

11. The analog-digital converter as in claim 10, wherein the number of master-comparator latches to be provided to one folding circuit is limited to less than a predetermined count.

12. The analog-digital converter as in claim 6, wherein potentials of said pair of inputs of said slave latch provided on the output side of said folding circuit are offset so that an amplitude level of a non-inverted output signal agrees with that of an inverted output signal.

13. The analog-digital converter of claims 6, 7, or 8, wherein a pre-amplifier is provided so that the difference voltage between a reference voltage and an analog input voltage signal is amplified and fed to each of said master-comparator latches.

* * * * *

UNITED STATES PATENT AND TRADEMARK OFFICE
CERTIFICATE OF CORRECTION

PATENT NO. : 5,307,067
DATED : April 26, 1994
INVENTOR(S) : Hiroshi Kimura et al.

It is certified that error appears in the above-indentified patent and that said Letters Patent is hereby corrected as shown below:

Col. 11, lines 34-35, delete "as well as through the non-inverted output QB side of MCL4"

Signed and Sealed this

Twenty-seventh Day of September, 1994

Attest:

BRUCE LEHMAN

Attesting Officer

Commissioner of Patents and Trademarks